United States Patent
Jang et al.

(10) Patent No.: US 6,926,920 B2
(45) Date of Patent: Aug. 9, 2005

(54) CHEMICAL VAPOR DEPOSITION (CVD) CALIBRATION METHOD PROVIDING ENHANCED UNIFORMITY

(75) Inventors: Shi Sheng Jang, Tainan (TW); Jian Hua Ma, Hsin-Chu (TW); Ko Chin Chung, Hsin-Chu (TW); Cheng Chung Wang, Tao-Yuan (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 316 days.

(21) Appl. No.: 10/167,607

(22) Filed: Jun. 11, 2002

(65) Prior Publication Data

US 2003/0226502 A1 Dec. 11, 2003

(51) Int. Cl.$^7$ .............................................. C23C 16/455
(52) U.S. Cl. ...................................... 427/8; 427/248.1
(58) Field of Search ........................ 427/8, 248.1, 569, 427/294

(56) References Cited

U.S. PATENT DOCUMENTS

| | | | |
|---|---|---|---|
| 5,284,519 A | | 2/1994 | Gadgil |
| 5,324,386 A | | 6/1994 | Murakami et al. |
| 5,503,678 A | * | 4/1996 | Usami .......................... 118/724 |
| 5,800,753 A | * | 9/1998 | Donadio ........................ 264/81 |
| 5,843,234 A | * | 12/1998 | Finn et al. ................... 118/715 |
| 5,994,678 A | | 11/1999 | Zhao et al. |
| 6,499,333 B1 | * | 12/2002 | Ko et al. ...................... 73/1.01 |

* cited by examiner

Primary Examiner—Bret Chen
(74) Attorney, Agent, or Firm—Tung & Associates

(57) ABSTRACT

A chemical vapor deposition (CVD) method for forming a microelectronic layer provides a source material dispensing nozzle employed within a chemical vapor deposition (CVD) apparatus which is employed within the chemical vapor deposition (CVD) method. The source material dispensing nozzle is calibrated to provide a calibrated source material dispensing nozzle. The calibrated source material dispensing nozzle is employed within the chemical vapor deposition (CVD) apparatus while employing the chemical vapor deposition (CVD) method for forming a chemical vapor deposition (CVD) deposited microelectronic layer upon the substrate positioned within the chemical vapor deposition (CVD) apparatus.

1 Claim, 3 Drawing Sheets

CHEMICAL VAPOR DEPOSITION (CVD) CALIBRATION METHOD PROVIDING ENHANCED UNIFORMITY

BACKGROUND OF THE INVENTION

1. Field of the Invention

The present invention relates generally to chemical vapor deposition (CVD) methods for forming microelectronic layers within microelectronic fabrications. More particularly, the present invention relates to chemical vapor deposition (CVD) methods and calibration apparatus for forming, with enhanced uniformity, microelectronic layers within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and microelectronic device and patterned microelectronic conductor layer dimensions have decreased, it has become increasingly more important within the art of microelectronic fabrication to fabricate within microelectronic fabrications microelectronic layers within enhanced uniformity, such as but not limited to enhanced film thickness uniformity and enhanced microelectronic material composition uniformity.

While enhanced uniformity is thus clearly desirable within the art of microelectronic fabrication when forming microelectronic layers within microelectronic fabrications, enhanced uniformity is nonetheless not always readily achievable without considerable problems within the art of microelectronic fabrication when forming microelectronic layers within microelectronic fabrications. In that regard, it is often difficult to form within microelectronic fabrications microelectronic layers with enhanced uniformity insofar as there often exist several interrelated variables which affect microelectronic layer uniformity when forming a microelectronic layer within a microelectronic fabrication.

It is thus desirable within the art of microelectronic fabrication to provide additional methods, materials and apparatus which may be employed for fabricating within microelectronic fabrications microelectronic layers with enhanced uniformity.

It is towards the foregoing object that the present invention is directed.

Various methods, materials and apparatus have been disclosed in the art of microelectronic fabrication for forming microelectronic layers with desirable properties within the art of microelectronic fabrication.

For example, Gadgil, in U.S. Pat. No. 5,284,519, discloses a chemical vapor deposition (CVD) method and a chemical vapor deposition (CVD) apparatus which provides an enhanced streamlined flow of reactant materials to a microelectronic substrate surface when forming while employing the chemical vapor deposition (CVD) method which employs the chemical vapor deposition (CVD) apparatus a microelectronic layer upon the microelectronic substrate surface, such in turn as to form the microelectronic layer with enhanced uniformity upon the microelectronic substrate surface while employing the chemical vapor deposition (CVD) method which employs the chemical vapor deposition (CVD) apparatus. In order to realize the foregoing result, the chemical vapor deposition (CVD) apparatus employs positioned interposed between a reactant mixing chamber and the microelectronic substrate surface a constricting plug formed of a series of parallel capillary tubes, such as to provide the enhanced streamlined flow of the reactant materials within the chemical vapor deposition (CVD) apparatus.

In addition, Murakami et al., in U.S. Pat. No. 5,324,386, discloses a chemical vapor deposition (CVD) method and a chemical vapor deposition (CVD) apparatus for forming, with enhanced composition uniformity, a compound semiconductor layer upon a microelectronic substrate employed within a microelectronic fabrication while employing the chemical vapor deposition (CVD) method which employs the chemical vapor deposition (CVD) apparatus. In order to realize the foregoing result, the chemical vapor deposition (CVD) method and the chemical vapor deposition (CVD) apparatus employ when forming the compound semiconductor layer upon the microelectronic substrate employed within the microelectronic fabrication a flow of a most reactive precursor source material within a plurality of precursor source materials employed for forming the compound semiconductor layer, where the flow of the most reactive precursor source material employed for forming the compound semiconductor layer is increased as a function of a distance from a centerline of the microelectronic substrate upon which is formed the compound semiconductor layer.

Finally, Zhao et al., in U.S. Pat. No. 5,994,678, discloses a chemical vapor deposition (CVD) method and a chemical vapor deposition (CVD) apparatus which may be employed for forming upon a microelectronic substrate employed within a microelectronic fabrication a titanium layer with an enhanced deposition rate of up to about 200 angstroms per minute. To realize the foregoing result, the chemical vapor deposition (CVD) method and the chemical vapor deposition (CVD) apparatus employ a ceramic heater assembly which allows for heating of the microelectronic substrate to a temperature of at least about 400 degrees centigrade, where the ceramic heater assembly is further isolated from a support member upon which it is positioned by a thermal choke such there is provided an enhanced thermal uniformity of the ceramic heater assembly when forming upon the microelectronic substrate when positioned thereupon the titanium layer while employing the chemical vapor deposition (CVD) method which employs the chemical vapor deposition (CVD) apparatus.

Desirable within the art of microelectronic fabrication are additional methods, materials and apparatus which may be employed for forming with enhanced uniformity microelectronic layers within microelectronic fabrications.

It is towards the foregoing object that the present invention is directed.

SUMMARY OF THE INVENTION

A first object of the present invention is to provide a method for forming a microelectronic layer within a microelectronic fabrication.

A second object of the present invention is to provide a method for forming a microelectronic layer in accord with the first object of the present invention, wherein the microelectronic layer is formed with enhanced uniformity.

A third object of the present invention is to provide a method for forming a microelectronic layer in accord with the first object of the present invention and the second object of the present invention, which method is readily commercially implemented.

In accord with the objects of the present invention, there is provided by the present invention a chemical vapor deposition (CVD) method for forming a microelectronic layer within a microelectronic fabrication.

To practice the method of the present invention, there is first provided a source material dispensing nozzle employed within a chemical vapor deposition (CVD) apparatus employed within a chemical vapor deposition (CVD) method for forming a chemical vapor deposition (CVD) deposited microelectronic layer upon a substrate positioned within the chemical vapor deposition (CVD) apparatus. There is then calibrated the source material dispensing nozzle to provide a calibrated source material dispensing nozzle. There is then employed the calibrated source material dispensing nozzle within the chemical vapor deposition (CVD) apparatus while employing the chemical vapor deposition (CVD) method for forming the chemical vapor deposition (CVD) deposited microelectronic layer upon the substrate positioned within the chemical vapor deposition (CVD) apparatus.

The present invention also contemplates a calibration and alignment apparatus which may be employed within the context of the present invention for providing the calibrated source material dispensing nozzle.

There is provided by the present invention a method for forming a microelectronic layer within a microelectronic fabrication, wherein the microelectronic layer is formed with enhanced uniformity. The present invention realizes the foregoing object by employing within a chemical vapor deposition (CVD) method for forming a microelectronic layer upon a substrate employed within a microelectronic fabrication a calibrated source material dispensing nozzle employed within a chemical vapor deposition (CVD) apparatus which is employed within the chemical vapor deposition (CVD) method.

The method of the present invention is readily commercially implemented. The present invention employs chemical vapor deposition (CVD) methods, chemical vapor deposition (CVD) materials and chemical vapor deposition (CVD) apparatus as are generally known in the art of microelectronic fabrication, further in conjunction with a calibration and alignment apparatus the use of which may readily be effected within the art of microelectronic fabrication. Since it is thus in a sense a process control and an calibration and alignment apparatus which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

There is provided by the present invention a method for forming a microelectronic layer within a microelectronic fabrication, wherein the microelectronic layer is formed with enhanced uniformity. The present invention realizes the foregoing object by employing within a chemical vapor deposition (CVD) method for forming a microelectronic layer upon a substrate employed within a microelectronic fabrication a calibrated source material dispensing nozzle employed within a chemical vapor deposition (CVD) apparatus which is employed within the chemical vapor deposition (CVD) method.

The present invention also contemplates a calibration and alignment apparatus which may be employed within the context of the present invention for calibrating and aligning a source material dispensing nozzle when forming a calibrated source material dispensing nozzle.

Figure 1:
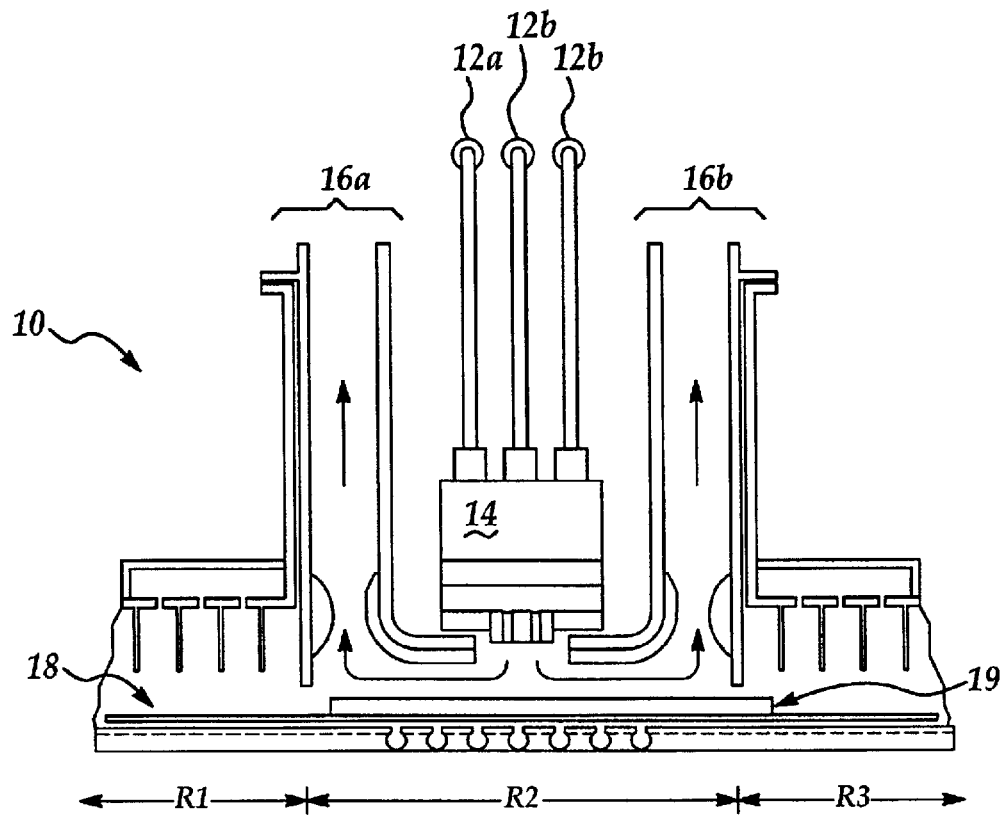
FIG. 1 shows a schematic elevation view diagram of a chemical vapor deposition (CVD) apparatus having incorporated therein a source material dispensing nozzle assembly in accord with the present invention.

Referring now to FIG. 1, there is shown a schematic elevation view diagram of a chemical vapor deposition (CVD) apparatus whose operation, with respect to forming with enhanced uniformity a chemical vapor deposition (CVD) deposited microelectronic layer upon a microelectronic substrate employed within a microelectronic fabrication while employing a chemical vapor deposition (CVD) method which employs the chemical vapor deposition (CVD) apparatus, may be enhanced in accord with the present invention.

Shown in FIG. 1 is a chemical vapor deposition (CVD) apparatus 10 generally comprising a substrate entry region R1, a chemical vapor deposition (CVD) region R2 and a substrate exit region R3. As is illustrated within the schematic elevation view diagram of FIG. 1, there is provided a transport means 18, which is typically and preferably, but not exclusively, a conveyor belt, positioned and operated such as to move a substrate 19 sequentially through the substrate entry region R1, the chemical vapor deposition (CVD) region R2 and the substrate exit region R3 of the chemical vapor deposition (CVD) apparatus 10. As is also illustrated within the schematic elevation view diagram of FIG. 1, within the chemical vapor deposition (CVD) region R2 of the chemical vapor deposition (CVD) apparatus 10 there is positioned a chemical vapor deposition (CVD) dispensing nozzle assembly 14 which is supplied by a series chemical vapor deposition (CVD) source material supplies 12a, 12b and 12c. Similarly, there is finally shown within the chemical vapor deposition (CVD) apparatus 10 whose schematic elevation view is illustrated in FIG. 1, and also within the chemical vapor deposition (CVD) region R2 of the chemical vapor deposition (CVD) apparatus 10, a pair of exhaust chambers 16a and 16b, which remove from the chemical vapor deposition (CVD) region R2 of the chemical vapor deposition (CVD) apparatus 10 spent chemical vapor deposition (CVD) source materials.

Within the preferred embodiment of the present invention, a substrate, such as the substrate 19, which may have formed thereupon a chemical vapor deposition (CVD) deposited microelectronic layer while employing the chemical vapor deposition (CVD) apparatus, may be a substrate employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications. More typically and preferably, although not exclusively, within the context of the preferred embodiment of the present invention the substrate 10 will be either a semiconductor substrate employed within a semiconductor integrated circuit microelectronic fabrication or a ceramic substrate employed within a ceramic substrate microelectronic fabrication.

Similarly, and also for example and without limitation, the chemical vapor deposition (CVD) apparatus 10 whose schematic elevation view diagram is illustrated in FIG. 1 may be employed for depositing while employing a chemical vapor deposition (CVD) method upon the substrate 19 as illustrated within FIG. 1 a chemical vapor deposition (CVD) deposited microelectronic layer selected from the group including but not limited to chemical vapor deposition (CVD) deposited microelectronic conductor layers, chemical vapor deposition (CVD) deposited microelectronic semiconductor layers and chemical vapor deposition (CVD) deposited microelectronic dielectric layers. More typically and preferably, the chemical vapor deposition (CVD) deposited microelectronic layer will be a chemical vapor deposition (CVD) deposited microelectronic dielectric layer such as may be chemical vapor deposition (CVD) deposited employing a chemical vapor deposition (CVD) method selected from the group including but not limited to an atmospheric pressure thermal chemical vapor deposition (APCVD) method, a sub-atmospheric pressure thermal chemical vapor deposition (SACVD) method, a low pressure thermal chemical vapor deposition (LPCVD) method and a plasma enhanced chemical vapor deposition (PECVD) method. Typically and preferably, the chemical vapor deposition (CVD) deposited microelectronic layer which may be chemical vapor deposition (CVD) deposited while employing the chemical vapor deposition (CVD) apparatus 10 as illustrated within the schematic elevation view diagram of FIG. 1.

As is understood by a person skilled in the art, a chemical vapor deposition (CVD) apparatus in accord with the chemical vapor deposition (CVD) apparatus 10 whose schematic elevation view diagram is illustrated in FIG. 1 will often provide non-uniform chemical vapor deposition (CVD) deposited microelectronic layers upon a substrate, such as the substrate 19. Typically the non-uniform chemical vapor deposition (CVD) deposited microelectronic layers will have at least either of a film thickness non-uniformity and a microelectronic material composition non-uniformity. It is towards the goal of attenuating such a non-uniformity of a chemical vapor deposition (CVD) deposited microelectronic layer formed upon a substrate, such as the substrate 19, that the present invention is directed.

Figure 2:
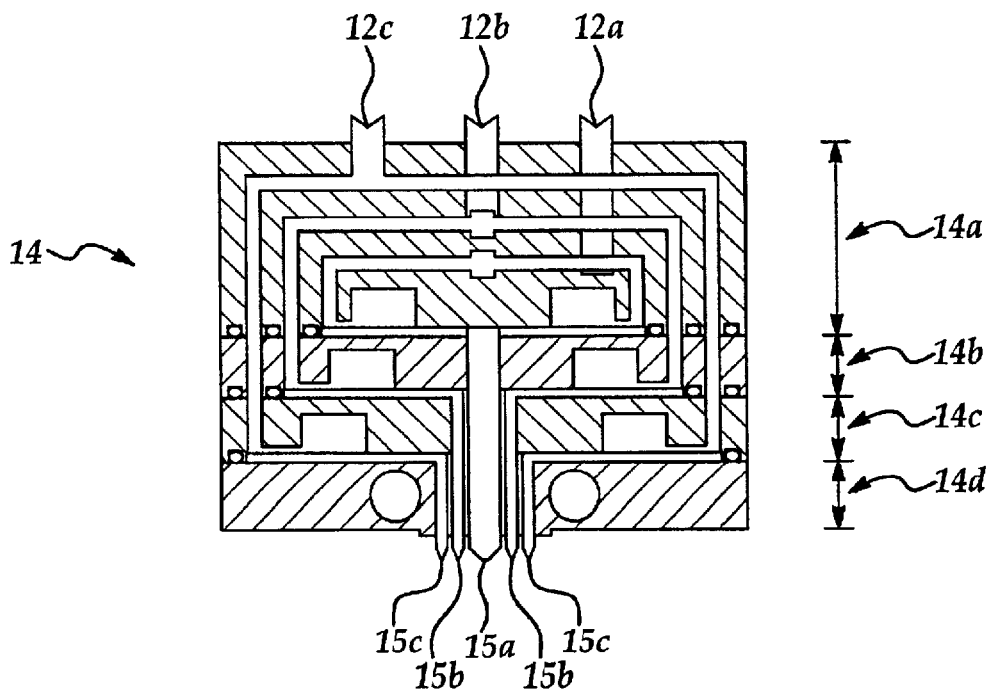
FIG. 2 and FIG. 3 show a pair of schematic cross-sectional diagrams of the source material dispensing nozzle assembly employed within the chemical vapor deposition (CVD) apparatus whose schematic elevation view diagram is illustrated in FIG. 1.

Referring now to FIG. 2, there is shown a schematic cross-sectional diagram illustrating an enlarged view of the chemical vapor deposition (CVD) dispensing nozzle 14 assembly as illustrated within the chemical vapor deposition (CVD) apparatus 10 whose schematic elevation view diagram is illustrated in FIG. 1.

As is illustrated within the schematic cross-sectional diagram of FIG. 2, and consistent with that which is illustrated within the schematic elevation diagram of FIG. 1, there is supplied to the chemical vapor deposition (CVD) dispensing nozzle assembly 14 a series of chemical vapor deposition (CVD) source material supplies 12a, 12b and 12c, which eventually exit the chemical vapor deposition (CVD) source material dispensing nozzle assembly 14 through a series of chemical vapor deposition (CVD) source material dispensing nozzle assembly tips 15a, 15b and 15c. Further, as illustrated within the schematic cross-sectional diagram of FIG. 2, the chemical vapor deposition (CVD) source material dispensing nozzle assembly 14 is fabricated employing a series of chemical vapor deposition (CVD) source material dispensing nozzle assembly plates 14a, 14b, 14c and 14d stacked one upon another.

Within a particularly preferred embodiment of the present invention when employing the chemical vapor deposition (CVD) dispensing nozzle assembly 14 as illustrated within the schematic cross-sectional diagram of FIG. 2 for forming a chemical vapor deposition (CVD) deposited silicon oxide microelectronic dielectric layer, there is supplied from: (1) the chemical vapor deposition (CVD) source material supply 12c and exited from the chemical vapor deposition (CVD) source material nozzle assembly tips 15c an ozone and oxygen mixture oxidant source material; (2) the chemical vapor deposition (CVD) source material supply 12b and exited from the chemical vapor deposition (CVD) source material dispensing nozzle assembly tips 15b a nitrogen separation source material; and (3) the chemical vapor deposition (CVD) source material supply 12a and exited from the chemical vapor deposition (CVD) source material dispensing nozzle assembly tip 15a a silicon source material, such as but not limited to tetraethylorthosilicate (TEOS) silicon source material or a silane silicon source material, such as to eventually form upon a substrate, such as the substrate 19, as illustrated within the schematic elevation view diagram of FIG. 1, the silicon oxide dielectric layer.

Integral to the present invention is the observation that it is desirable to calibrate and align each of the chemical vapor deposition (CVD) source material dispensing nozzle assembly tips 15a, 15b and 15c, in order to ultimately form upon a substrate, such as the substrate 19, a microelectronic layer with enhanced uniformity, such as but not limited to enhanced film thickness uniformity and enhanced microelectronic material composition uniformity.

Figure 3:
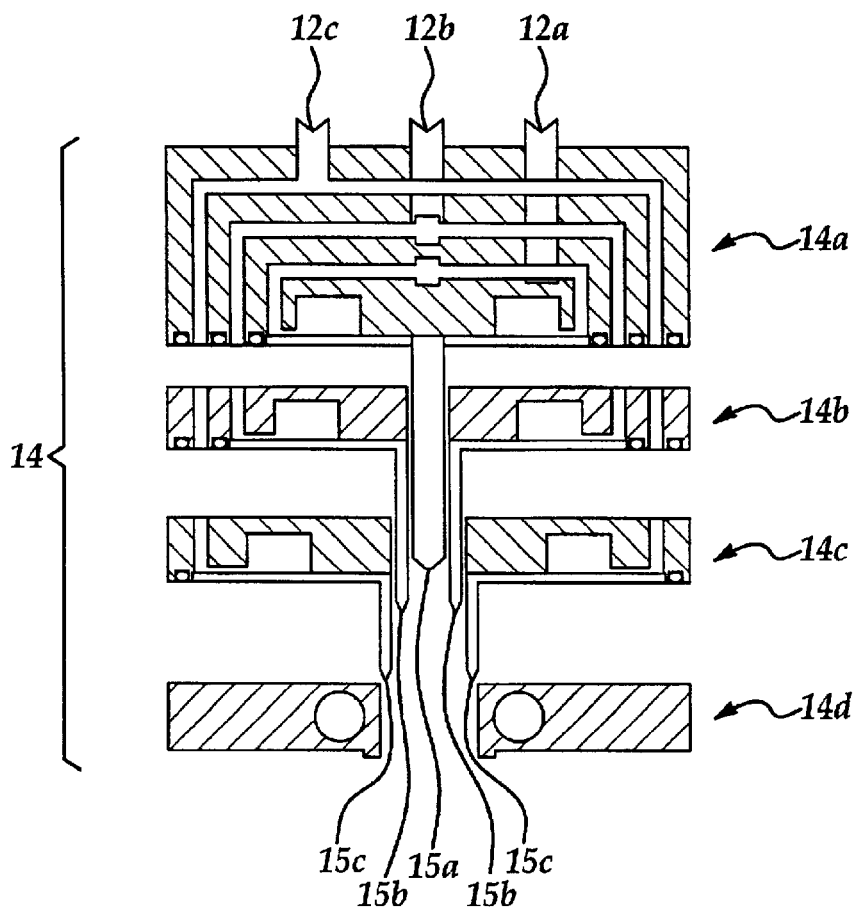

Shown in FIG. 3 is an exploded schematic cross-sectional diagram of the chemical vapor deposition (CVD) dispensing nozzle assembly 14 whose schematic cross-sectional diagram is illustrated in FIG. 2.

As is illustrated within the schematic cross-sectional diagram of FIG. 3, each of the chemical vapor deposition (CVD) source material dispensing nozzle plates 14a, 14b, 14c and 14d may be disassembled, and with the exception of the chemical vapor deposition (CVD) source material dispensing nozzle assembly plate 14d which serves as a chemical vapor deposition (CVD) source material dispensing nozzle assembly base plate, there is formed integral to the remainder of the chemical vapor deposition (CVD) source material dispensing nozzle assembly plates 14a, 14b and 14c the corresponding chemical vapor deposition (CVD) source material dispensing nozzle assembly tips 15a, 15b or 15c which fit coaxially through an aperture defined within the chemical vapor deposition (CVD) source material dispensing nozzle plate 14d.

Within the context of the preferred embodiment of the present invention, it is a calibration and an alignment of the chemical vapor deposition (CVD) source material dispensing nozzle assembly tips 15a, 15b and 15c which is generally critical within the context of the present invention to provide while employing the chemical vapor deposition (CVD) apparatus whose schematic elevation view diagram is illustrated in FIG. 1 a chemical vapor deposition (CVD) deposited microelectronic layer with enhanced uniformity.

Figure 4:
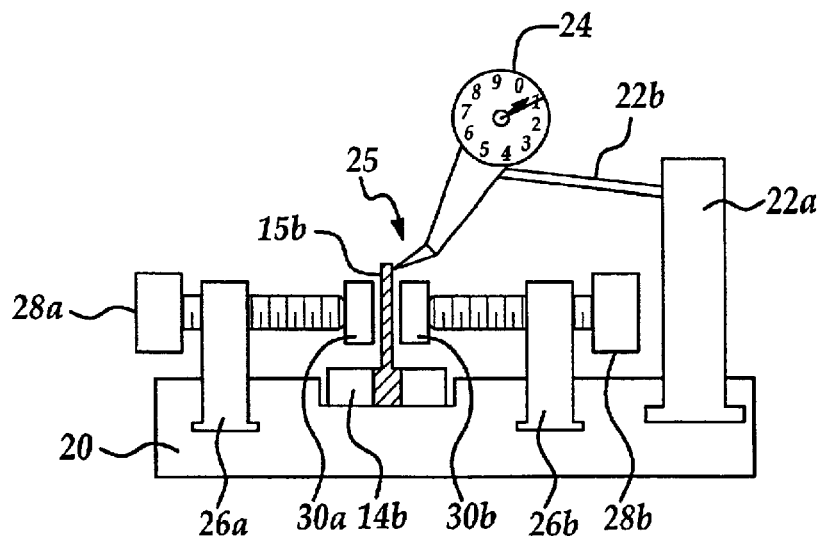
FIG. 4 and FIG. 5 show, respectively, a schematic elevation view diagram and a schematic plan view diagram of a chemical vapor deposition (CVD) source material dispensing nozzle calibration and alignment apparatus in accord with a preferred embodiment of the present invention.

Referring now to FIG. 4, there is shown a schematic elevation view diagram of a calibration and alignment apparatus which may be employed to calibrate and align individual chemical vapor deposition (CVD) source material dispensing nozzle assembly tips 15a, 15b and 15c in accord with the preferred embodiment of the present invention.

As is illustrated within the schematic elevation view diagram of FIG. 4, the calibration and alignment apparatus comprises in a first instance a base 20 upon which is affixed, for example and without limitation, the chemical vapor deposition (CVD) source material dispensing nozzle plate 14b (although other of the chemical vapor deposition (CVD) source material dispensing nozzle plates 14a, 14b and 14c may also be employed), having protruding therefrom the chemical vapor deposition (CVD) source material dispensing nozzle assembly tip 15b, wherein: (1) the chemical vapor deposition (CVD) source material dispensing nozzle assembly plate 14b is interposed between a pair of adjusting means supports 26a and 26b having connected thereto a pair of adjusting means 28a and 28b (generally illustrated as a pair of adjusting screws) further having connected thereto a pair of contact pads 30a and 30b; and (2) there is further affixed to the base 20 a measurement probe support 22a/22b which in turn supports a measurement probe meter 24 (which may be, but is not limited to, a micrometer) and a measurement probe tip 25.

Although the schematic elevation view diagram of FIG. 4 illustrates the chemical vapor deposition (CVD) source material dispensing nozzle assembly tip 15b as a single chemical vapor deposition (CVD) source material dispensing nozzle assembly tip, it is understood by a person skilled in the art that within the context of the schematic cross-sectional diagram of FIG. 3 there is in fact a pair of chemical vapor deposition (CVD) source material dispensing nozzle assembly tips 15b which will be separated within the context of the schematic elevation view diagram of FIG. 4 by a filler plate which is not otherwise specifically illustrated within the schematic elevation view diagram of FIG. 4.

As is understood by a person skilled in the art, the pair of adjusting means 28a and 28b, in conjunction with the pair of contact pads 30a and 30b, may be positioned and tensioned against the chemical vapor deposition (CVD) source material dispensing nozzle assembly tip 15b while employing the measurement probe meter 24 in a fashion such as to calibrate and align a geometric factor of the chemical vapor deposition (CVD) source material dispensing nozzle assembly tip 15b to an expected value of the geometric factor to provide optimal flow quantity and/or optimal flow direction of the chemical vapor deposition (CVD) source material dispensing nozzle assembly tip 15b, which in turn provide optimal microelectronic layer uniformity, such as but not limited to film thickness uniformity and microelectronic material composition uniformity, when forming while employing a chemical vapor deposition (CVD) method in conjunction with the chemical vapor deposition (CVD) source material dispensing nozzle assembly 14 whose schematic cross-sectional diagram is illustrated in FIG. 2 and the chemical vapor deposition (CVD) apparatus 10 whose schematic elevation view diagram is illustrated in FIG. 1, a chemical vapor deposition (CVD) deposited microelectronic layer upon a substrate. Within the preferred embodiment of the present invention, the geometric factor may include, but is not limited to an angle of attachment of the chemical vapor deposition (CVD) source material dispensing nozzle assembly tip 15b to the chemical vapor deposition (CVD) source material dispensing nozzle assembly plate 14b.

Figure 5:
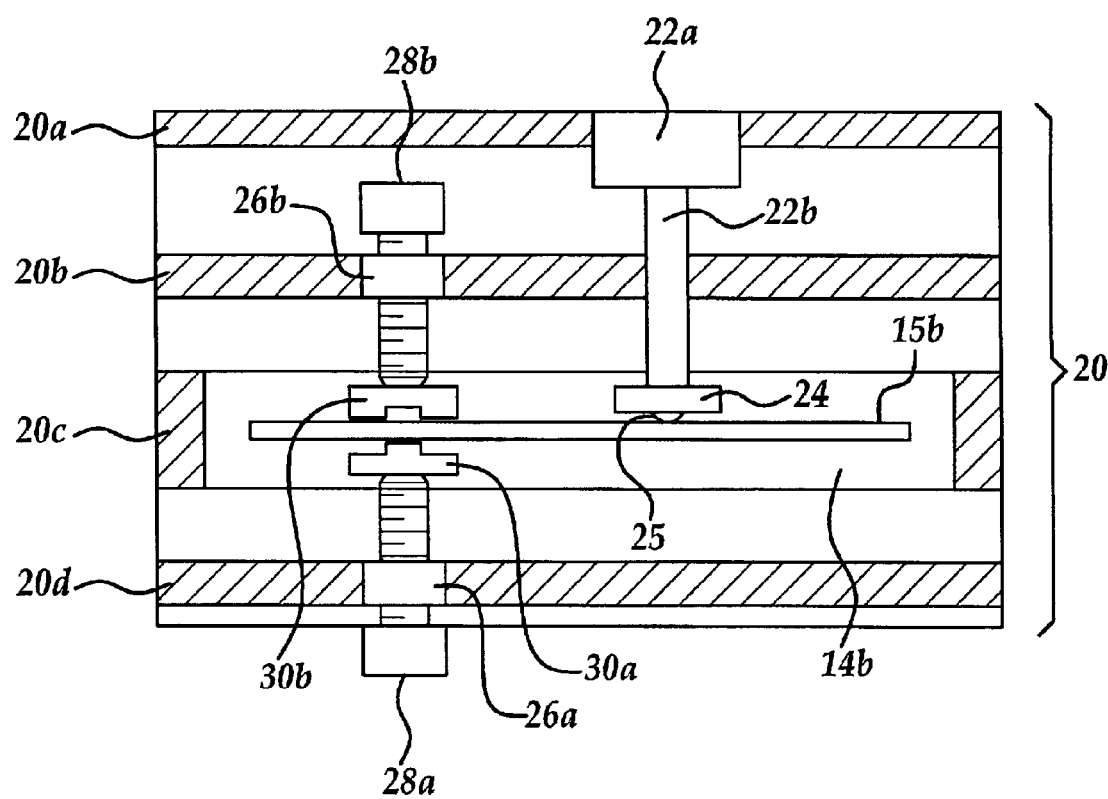

Referring now to FIG. 5, there is shown a schematic plan view diagram of a calibration and alignment apparatus corresponding with the schematic elevation view diagram of the calibration and alignment apparatus as illustrated in FIG. 4.

As is illustrated within the schematic plan view diagram of FIG. 1, there is shown within the base 20 a series of base troughs 20a, 20b, 20c and 20d into which are laterally movably positioned the corresponding measurement probe support 22a, the pair of adjusting means supports 26a and 26b and the chemical vapor deposition (CVD) source material dispensing nozzle assembly plate 14b. Thus, within the calibration and alignment apparatus of the preferred embodiment of the present invention as employed within the context of a chemical vapor deposition (CVD) source material assembly plate having formed therein a chemical vapor deposition (CVD) source material dispensing nozzle assembly tip in the form of an elongated lateral slit, an entire length of the elongated lateral slit may be calibrated and aligned while employing the calibration and alignment apparatus of the present invention.

As is understood by a person skilled in the art, the preferred embodiment of the present invention is illustrative of the present invention rather than limiting of the present invention. Revisions and modifications may be made to materials, structures and dimensions through which is provided: (1) a chemical vapor deposition (CVD) method; and (2) a calibration and alignment apparatus, in accord with the preferred embodiment of the present invention while still providing a chemical vapor deposition (CVD) method and a calibration and alignment apparatus in accord with the present invention, further in accord with the appended claims.

What is claimed is:

1. A chemical vapor deposition (CVD) method for forming a microelectronic layer comprising:

providing a source material dispensing nozzle employed within a chemical vapor deposition (CVD) apparatus which is employed within a chemical vapor deposition (CVD) method for forming a chemical vapor deposition (CVD) deposited microelectronic layer upon a substrate positioned within the chemical vapor deposition (CVD) apparatus;

calibrating the source material dispensing nozzle to provide a calibrated source material dispensing nozzle; and employing the calibrated source material dispensing nozzle within the chemical vapor deposition (CVD) apparatus while employing the chemical vapor deposition (CVD) method for forming the chemical vapor deposition (CVD) deposited microelectronic layer upon the substrate positioned within the chemical vapor deposition (CVD) apparatus, wherein:

the source material dispensing nozzle is calibrated with respect to a source material flow direction; and the source material dispensing nozzle is calibrated mechanically while employing a calibration apparatus which provides for:

measurement of a deviation of a geometric factor of the source material dispensing nozzle from an expected value of the geometric factor; and alignment of the source material dispensing nozzle to the expected value of the geometric factor.

* * * * *